(12) United States Patent
Viehmann

(10) Patent No.: US 6,584,006 B2
(45) Date of Patent: Jun. 24, 2003

(54) MRAM BIT LINE WORD LINE ARCHITECTURE

(75) Inventor: Hans-Heinrich Viehmann, South Burlington, VT (US)

(73) Assignee: Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 09/965,086

(22) Filed: Sep. 27, 2001

(65) Prior Publication Data

US 2002/0097597 A1 Jul. 25, 2002

Related U.S. Application Data

(60) Provisional application No. 60/263,984, filed on Jan. 24, 2001.

(51) Int. Cl.[7] .............................................. G11C 17/02
(52) U.S. Cl. ........................................... 365/97; 365/66
(58) Field of Search ...................................... 365/97, 66

(56) References Cited

U.S. PATENT DOCUMENTS

| 4,498,154 A | | 2/1985 | Hoffmann ................... 365/149 |
| 5,388,068 A | * | 2/1995 | Ghoshal et al. ............. 365/162 |
| 5,506,813 A | | 4/1996 | Mochizuki et al. ..... 365/230.03 |
| 5,943,284 A | | 8/1999 | Mizuno et al. ........ 365/230.03 |
| 6,111,783 A | | 8/2000 | Tran et al. .................. 365/171 |

* cited by examiner

*Primary Examiner*—M. Tran
(74) *Attorney, Agent, or Firm*—Slater & Matsil, L.L.P.

(57) ABSTRACT

A memory device comprising a plurality of bit lines and a plurality of word lines forming a cross-point array. A memory cell is located at each of the cross-points in the array. A bit decoder and word decoder are coupled to the bit lines and word lines, respectively. A first series of switch circuits are coupled to and located along the adjacent bit lines resulting in the array being divided into segments along the adjacent bit lines such that a shortened programming current path is provided which results in decreased resistance across the device.

20 Claims, 5 Drawing Sheets

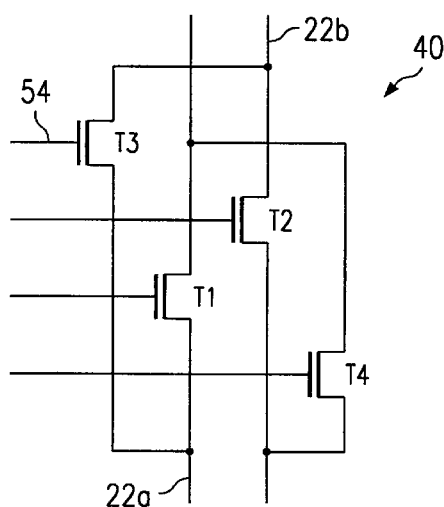
FIG. 4
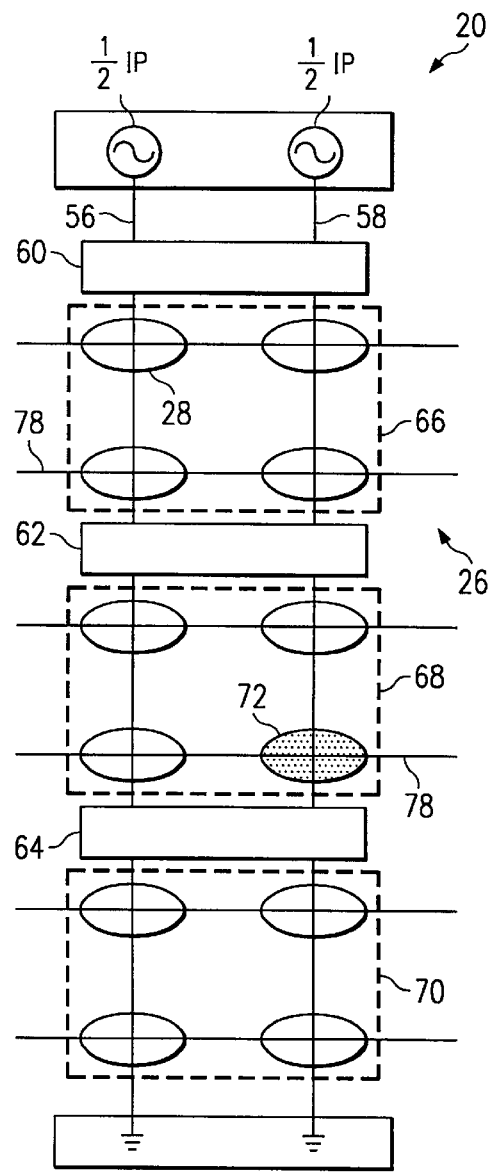
FIG. 6
| CURRENT | T1 | T2 | T3 | T4 |
|---|---|---|---|---|
| L56 + L58 → L56 | ON | OFF | OFF | ON |
| L56 + L58 → L58 | OFF | ON | ON | OFF |
| L56 → L56 + L58 | ON | OFF | ON | OFF |
| L58 → L56 + L58 | OFF | ON | OFF | ON |
| L56 + L58 → L56 + L58 | ON | ON | OFF | OFF |
FIG. 5

MRAM BIT LINE WORD LINE ARCHITECTURE

This patent claims the benefit of U.S. Provisional Patent Application No. 60/263,984, filed Jan. 24, 2001, which is incorporated herein by reference.

TECHNICAL FIELD OF THE INVENTION

This invention relates to semiconductor memory devices and more particularly to a random access memory architecture having lowered bit and word line resistance across the architecture.

BACKGROUND OF THE INVENTION

Traditional memory devices, such as DRAM and FLASH memory devices, generally include an array of word and bit lines that intersect to form an array. At each intersection is coupled a memory cell. Programming current can be provided to the word and bit lines that correspond to the desired memory cell in order to write data to or read data from the memory cell. Magnetic random access memory (MRAM) devices are an emerging technology which provide numerous benefits over DRAM and FLASH memory devices such as non-volatility in contrast to the DRAM device, and faster operation, in contrast to the FLASH memory devices.

In traditional memory devices, the length of the word and bit lines that form the array is not typically a design concern. However, the resistance across the bit and word lines is of particular concern in magnetic random access memory (MRAM) devices because the programming current in MRAM devices is higher than in traditional memory devices. The length of the bit and word lines is restricted by the resistance of the lines when the programming current is propagated through the lines. While longer word and bit lines provide larger arrays and better efficiency, the longer word and bit lines have high resistance that results in an excessive voltage drop and undesirable heat generation.

In MRAM devices, high resistance across the word and bit lines can cause several problems. One problem is a resulting voltage drop across bit and word lines. If the voltage falls outside of an operating voltage range the memory cell could be damaged.

SUMMARY OF THE INVENTION

These and other problems are generally solved or circumvented, and technical advantages are generally achieved by the present invention, which in one embodiment provides a random access memory architecture.

In one preferred embodiment memory device of the present invention, the device comprises a plurality of bit lines and a plurality of word lines. The plurality of word lines form a cross-point array with the plurality of bit lines. One of a plurality of memory cells is located at each of the cross-points in the array. A bit decoder having a current source and current sink is coupled to the bit lines and a word decoder having a current source and a current sink is coupled to the word lines. A first series of switch circuits are coupled to two adjacent bit lines. The first series of switch circuits are located along the adjacent bit lines resulting in the array being divided into segments along the adjacent bit lines. The memory cell at the corresponding cross-point is selected for writing when the corresponding bit and word lines are provided with a predetermined amount of current.

In another preferred embodiment, the switch circuits are located along the word lines. In yet another embodiment, the memory device will utilize a first series of switch circuits along the bit lines and a second series of switch circuits are coupled to two adjacent word lines. The second series of switch circuits are located along the adjacent word lines resulting in the array being divided into segments along the adjacent word lines.

One advantage of a preferred embodiment of the present invention is that it reduces the resistance across word and bit lines which limit bit and word line length.

Another advantage of a preferred embodiment of the present invention is that it uses an easily implemented switch circuit to reduce resistance across the word and bit lines.

A further advantage of a preferred embodiment of the present invention is that some of the architecture of the preferred embodiment can be located beneath the array to reduce the amount of physical space needed.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the concepts and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 4 illustrates a preferred embodiment switch circuit of the present invention;

FIG. 5 is a truth table illustrating the operation of the switch circuits;

FIG. 6 is a portion of a preferred embodiment of the present invention; and

DETAILED DESCRIPTION OF THE PREFERRED EMBODIMENTS

The making and using of the presently preferred embodiments is discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention. Although the present invention will be discussed in the context of MRAM applications, it should be appreciated by those skilled in the art that the present invention may be utilized in other applications.

Figure 1:
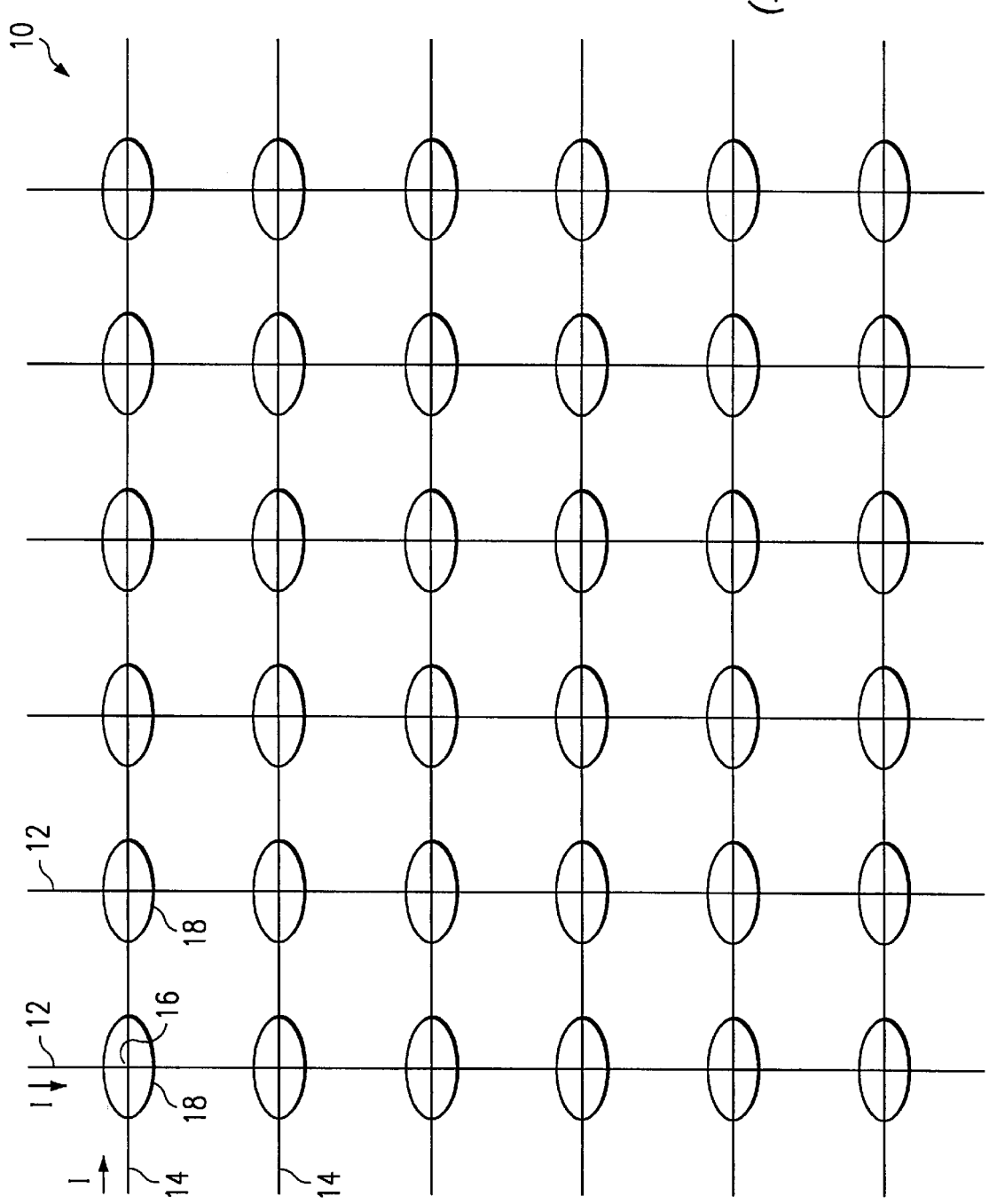
FIG. 1 illustrates a prior art memory cell array.

FIG. 1 illustrates a prior art MRAM array 10. The MRAM array 10 comprises bit lines 12 and word lines 14 which intersect to form points 16. At each point 16 is located a memory cell 18. The bit lines 12 and word lines 14 each have a decoder (not shown) which contains circuitry to provide a programming current I to the bit line 12 and word line 14. However, because of the length of the bit line 12 and word line 14, the resistance of these lines when the programming current I is provided is high and causes the voltage to drop across the bit and word lines. The bit and word lines 12, 14 can be shortened to reduce the resistance. Short bit and word lines, however, result in small arrays that increase the physical space needed. With decreasing physical size of semiconductor devices, this proposes an unacceptable condition. The short bit and word lines 12, 14 also result in poor efficiency.

Figure 2:
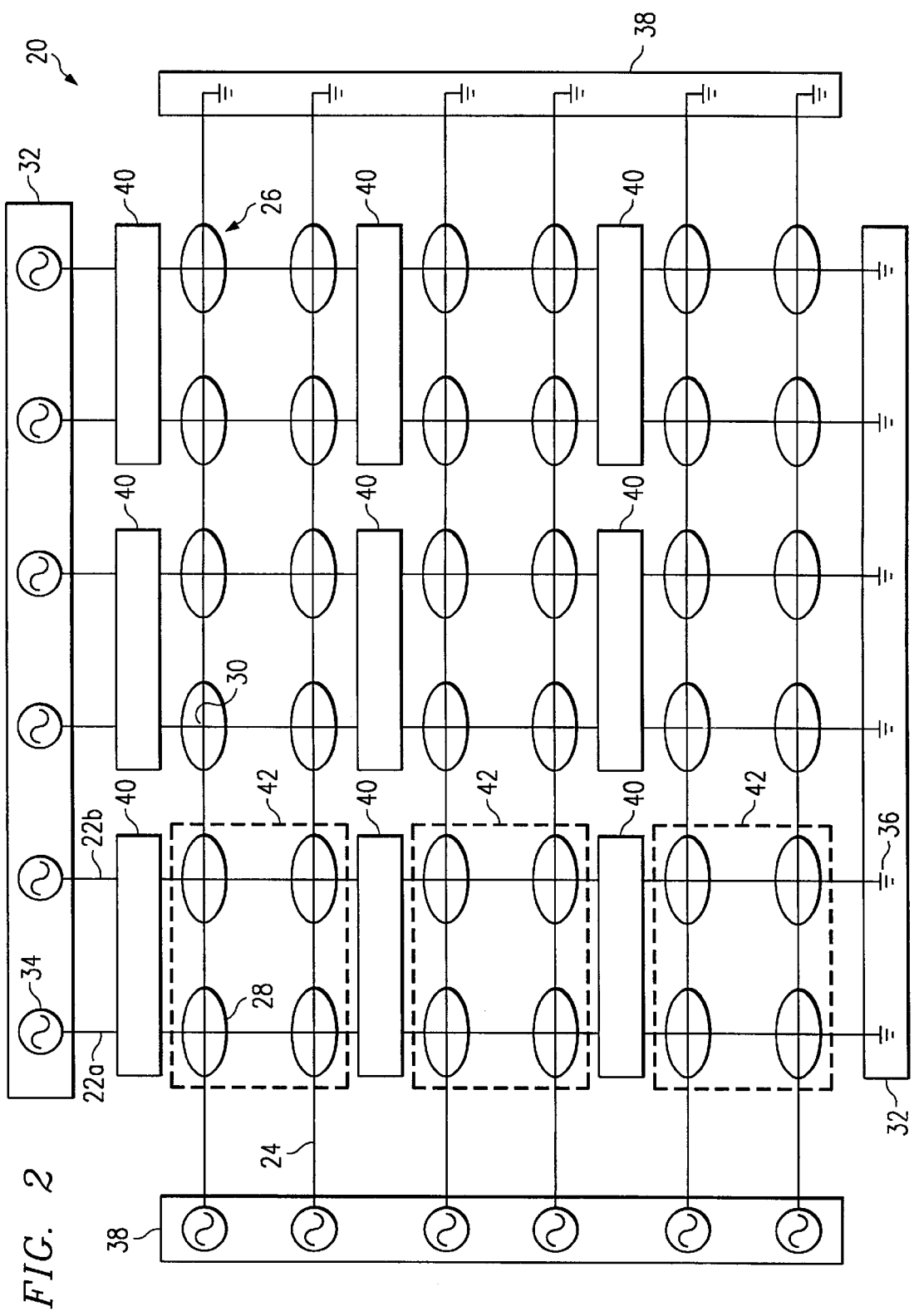
FIG. 2 illustrates a preferred embodiment memory device of the present invention.

FIG. 2 illustrates a preferred embodiment memory device 20 of the present invention. The memory device 20 comprises a plurality of bit lines 22 and a plurality of word lines 24 that form a cross-point array with the plurality of bit lines 22 (shown as 22a and 22b). A plurality of memory cells 28 are located at cross-points 30 which correspond to an intersection of one of the plurality of bit lines 22 with one of the plurality of word lines 24. Coupled to the plurality of bit lines 22 is a bit decoder 32 having current sources 34 and current sinks 36. A word decoder 38 is coupled to the plurality or word lines 24. The word decoder 38 also has current sources 34 and current sinks 36. A first series of switch circuits 40 is coupled to two adjacent bit lines 22. The first series of switch circuits 40 is located along two adjacent bit lines 22 resulting in the array 26 being divided into segments 42 along the adjacent bit lines. For exemplary purposes the two adjacent bit lines 22 are divided into three segments, however, it should be appreciated by those skilled in the art that any number of switch circuits can be used along two adjacent bit lines 22 to divide the array 26 into any number of segments 42. The number of switches used is determined by the resistance and available space beneath the array. Each of the segments 42 will contain multiple memory cells 28, preferably in the range of 128 to 256 memory cells 28. In FIG. 2, each of the segments 42 is shown having only two memory cells 28 for clarity.

Referring back to FIG. 1, in the prior art, a programming current I would be delivered to the corresponding bit line 22 of a given memory cell 28 to be selected for writing. In the present invention the programming current $I_p$ is divided between two adjacent bit lines 22a, 22b. About one-half of the programming current $I_p$ is provided to each of the two adjacent bit lines 22a, 22b. However, it should be appreciated by those skilled in the art that any portion of the programming current $I_p$ can be provided to each of two adjacent bit lines 22a, 22b as is sufficient to allow the array to operate as described. When data is to be written to a memory cell 28, the switch circuits 40 are utilized to provide the entire programming current $I_p$ to one of the bit lines 22a or 22b in a segment 42. By providing programming current $I_p$ to only that segment 42, the overall resistance is lowered without shortening the bit lines 22a, 22b. This is because the programming current flows through two conductors 22a and 22b in two of the segments and only flows through a single conductor for the one segment containing the memory cell to be programmed.

Figure 3A:
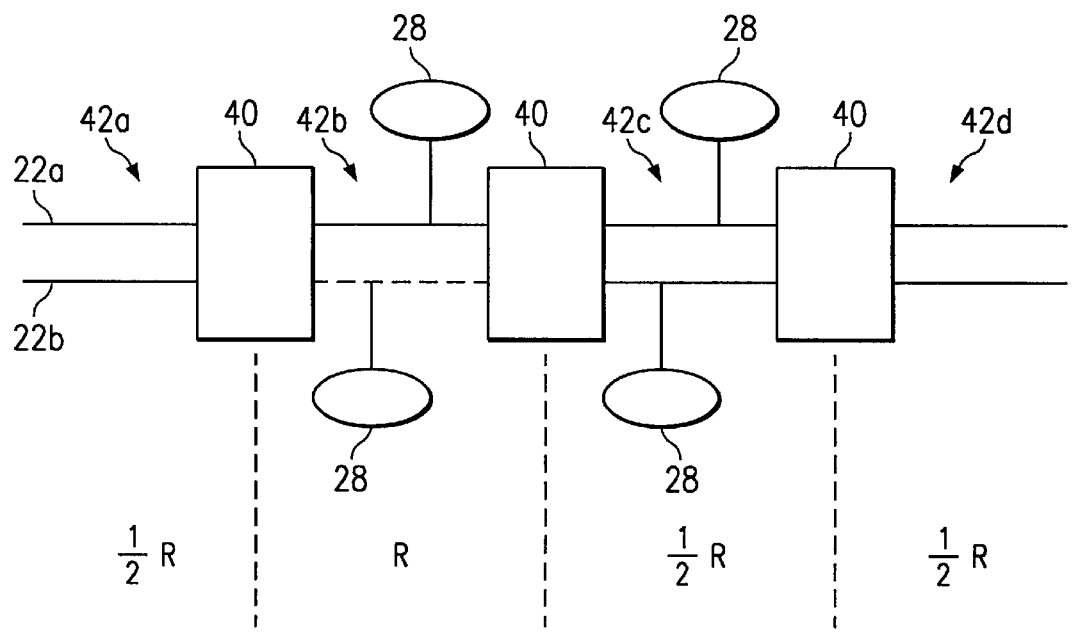
FIG. 3a illustrates the reduced line resistance achieved by use of the preferred embodiments of the invention in contrast to the prior art, illustrated in FIG. 3b.
Figure 3B:
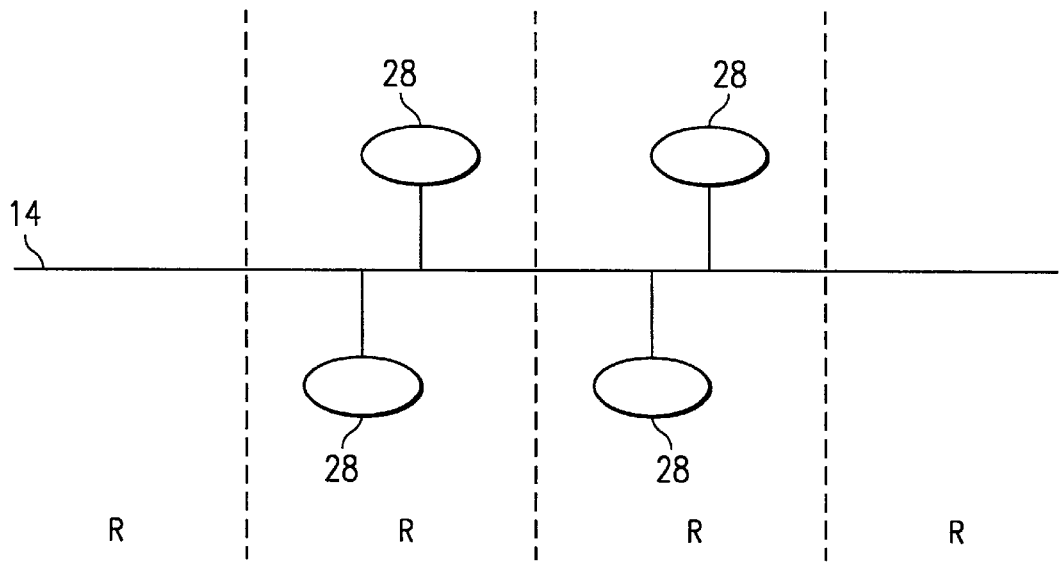

FIG. 3a illustrates the reduced line resistance achieved by the use of the preferred embodiments of the invention in contrast to the prior art illustrated in FIG. 3b. As illustrated in FIG. 3a, programming current $I_p$ flows through both lines 22a and 22b in the first segment 42a, as well as in segments 42c and 42d. Each of these segments, then, have only half the resistance they would otherwise have in a prior art single line implementation of FIG. 3b. Segment 42b, which contains the memory cell 28 to be programmed, has the full programming current $I_p$ flowing through only a single conductor 22a, so that the memory cell connected to conductor 22a receives the full programming current $I_p$. This segment 42b would contribute the same amount of line resistance as a prior art bit line, because the current is flowing though only one conductor. Cumulatively, the line resistance for line 14 of FIG. 3b is 4*R (normalized to the resistance of one line segment of line 14. By contrast, the cumulative line resistance for the embodiment shown in FIG. 3a is 2.5*R. As such, the illustrated embodiment provides only 5/8 the total line resistance or a reduction of 37.5% of line resistance over the prior art. One skilled in the art will recognize that additional line resistance improvement can be obtained as the number of switch circuits, axid hence line segments, increases. The above described model is not entirely accurate, however, as the on state resistance of switch circuit 40 must also be taken into account. Using well known CMOS technology, however, the on state resistance of the switch circuit can be minimized, as discussed further below.

FIG. 4 illustrates a preferred embodiment switch circuit 40 of the present invention that allows a memory cell array to be divided into segments. The segments effectively shorten the length of bit and word lines that are activated by the current $I_p$ at any given time. This "shortened" line length within a segment reduces the resistance across the bit lines, providing improved operation of the memory device.

The preferred embodiment switch circuit 40 comprises transistors T1, T2, T3, and T4. The transistors T1, T2, T3, and T4 are turned on by control lines 54 which are typically connected to a control circuit (not shown). In the preferred embodiments, the control circuit is realized with decoders 32 and 34. By turning on various combinations of the transistors T1, T2, T3, and T4 in the switch circuit 40, the path of the programming current $I_p$ can be changed to select particular segments in the memory device. The truth table of FIG. 5, for example, illustrates how turning on the various combinations of transistors T1, T2, T3, and T4 provides the entire current $I_p$ through one or the other of two adjacent bit lines 56 and 58 or the current originally provided to each of the two adjacent bit lines 56, 58 is continued through each of the two adjacent bit lines 56, 58. In the latter state, neither of the two adjacent bit lines 56, 58 in a segment is selected. The operation of switch circuit 40 is discussed in greater detail below with reference to the figures.

Referring to FIG. 6 which shows a portion of the array 26 within the memory device 20, the switch circuits along the two adjacent bit lines 56, 58 can be activated by their respective control signals to provide programming current to either of the bit lines 56, 58 in a particular segment. For example, three switch circuits 60, 62, 64 are illustrated. The three switch circuits 60, 62, 64 divide the array into three segments 66, 68, 70 thus shortening the length of the bit lines 56, 58 that can be provided programming current at any given time. About one-half of the programming current $I_p$ is originally provided to each of the bit lines 56 and 58. If the memory cell 72 is to be selected for writing, the entire programming current $I_p$ will be provided to that portion of bit line 58 that resides in segment 68. To accomplish this, the switch circuit 60 will operate to turn on transistors T1 and T2 (see truth table in FIG. 5 and the schematic of FIG. 4) to continue to allow about one-half of the programming current $I_p$ to flow to each of the bit lines 56, 58. In this state, none of the memory cells coupled to the portions of bit lines 56,58 residing in segment 66 will be selected. Because the memory cell 72 resides in segment 68, the next switch circuit 62 must be programmed to provide programming current $I_p$ to bit line 58. Referring to the truth table in FIG. 5 and the schematic of FIG. 4, to provide the entire programming current $I_p$ to line 58, transistors T2 and T3 must be turned on. Thus, data can be written to the memory cell 72 if its corresponding word line 78 is also provided with programming current $I_p$.

In order to lessen the line resistance of the next segment 70, the programming current $I_p$ should flow through both conductors 56 and 58. Thus, the succeeding switch circuit 64 must be programmed to allow the programming current $I_p$ to be split between those portions of the bit lines 56, 58 that reside in segment 70. Again referring to the truth table in FIG. 5, to provide an amount of current less than the programming current to each of the conductors 56, 58, transistors T2 and T4 must be turned on. This is accomplished by splitting the programming current $I_p$ coming from that portion of bit line 58 that resides in segment 68. Thus, the control circuit (not shown) must be designed to program the control lines to each of the switch circuits such that only one memory cell in a corresponding segment and at a corresponding bit line can receive the programming current at any given time.

Figure 7:
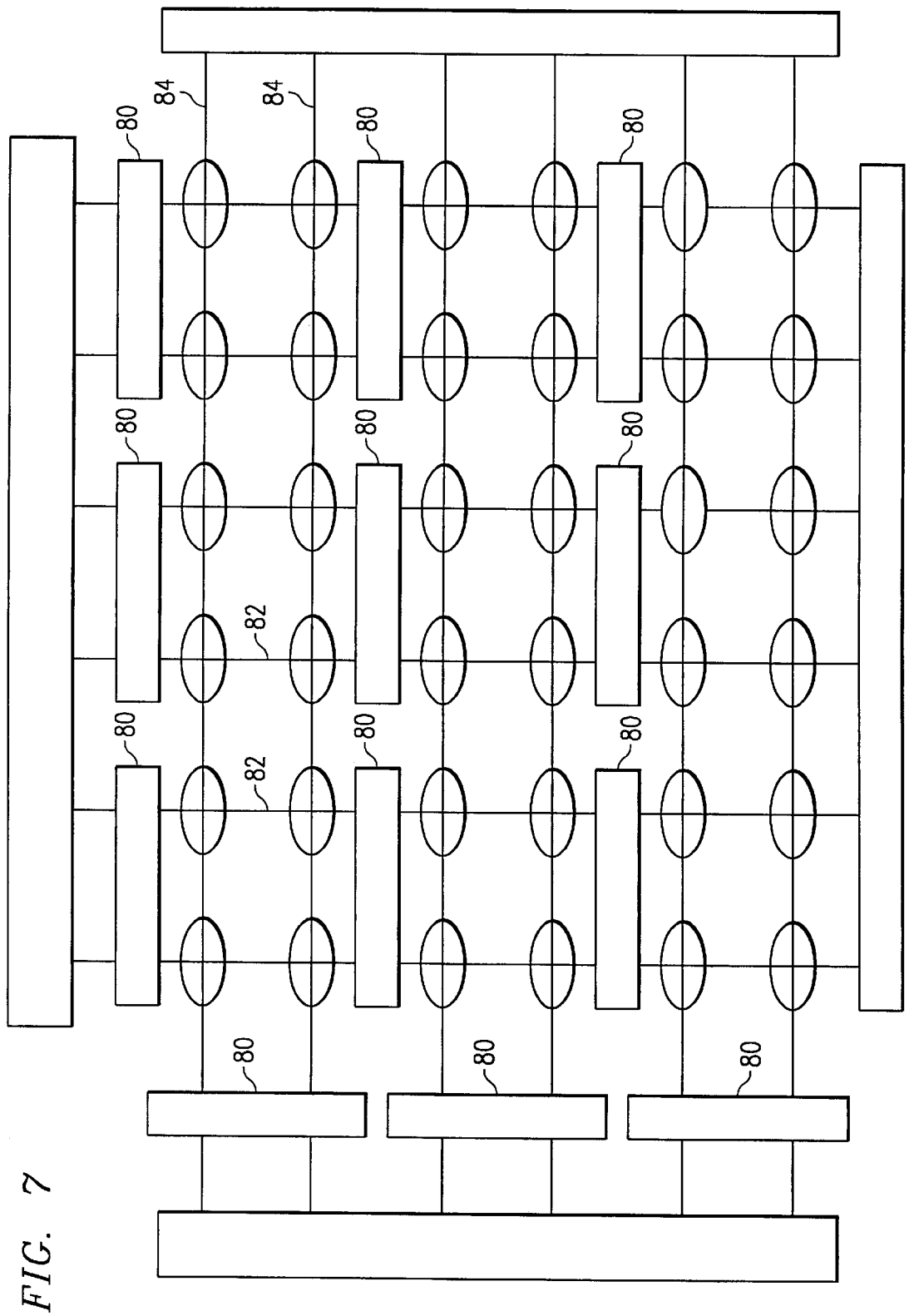
FIG. 7 is another preferred embodiment memory device of the present invention.

In another embodiment of the present invention, switch circuits can be utilized on the word lines instead of the bit lines to reduce the amount of resistance across the word lines. In yet another embodiment switch circuits 80 are utilized on both the bit and word lines 82 and 84, respectively, as shown in FIG. 7 to reduce the amount of resistance across both the bit and word lines 83, 84. In another embodiment the switch circuit logic is located beneath the array to reduce the amount of physical space needed across the array. Because the array in the MRAM is free of transistors, there is an opportunity to put some logic beneath the array.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A memory device comprising:
a plurality of bit lines;
a plurality of word lines, the plurality of word lines forming a cross-point array with the plurality of bit lines;
a plurality of memory cells, whereby one of the plurality of memory cells is located at each of the cross-points in the array;
a bit decoder coupled to the bit lines, the bit decoder having current sources and current sinks coupled to the bit lines;
a word decoder coupled to the word lines, the word decoder having current sources and current sinks coupled to the word lines; and
a first series of switch circuits coupled to two adjacent bit lines, the first series of switch circuits located along the adjacent bit lines resulting in the array being divided into segments along the adjacent bit lines;
whereby the memory cell at the corresponding cross-point is selected for writing when the corresponding bit and word lines are provided with a programming current.

2. The device as in claim 1 wherein the device is a magnetic random access memory (MRAM) device.

3. The device as in claim 1 wherein the programming current is 5 milliamps.

4. The device as in claim 1 wherein the amount of programming current sent through each of the two adjacent bit lines is equal to about one half of the programming current.

5. The device as in claim 1 wherein the switch circuits are designed to allow less than the programming current to flow through each of the two adjacent bit lines resulting in none of the plurality of memory cells coupled to either of the adjacent bit lines within a segment being selected for writing.

6. The device as in claim 5 wherein each switch circuit is designed to allow the programming current to flow through either one of the two adjacent bit lines in a segment resulting in memory cell coupled to the bit line within a segment being selected for writing.

7. The device as in claim 1 wherein a second series of switch circuits are coupled to two adjacent word lines, the second series of switch circuits located along the adjacent word lines resulting in the array being divided into segments along the adjacent word lines.

8. The device as in claim 7 wherein the amount of programming current sent through each of the two adjacent word lines is equal to about one half of the programming current.

9. The device as in claim 7 wherein the second series of switch circuits are designed to allow less than the programming current to flow through each of the two adjacent word lines resulting in none of the plurality of memory cells coupled to either of the adjacent word lines within a segment being selected for writing.

10. The device as in claim 9 wherein each of the second series of switch circuit is designed to allow programming current to flow through either one of the two adjacent word lines in a segment resulting in the memory device coupled to the word line within a segment being selected for writing.

11. The device as in claim 7 wherein each of the first and second series of switch circuits comprises a series of transistors, each transistor connected to a control line whereby a signal is provided to turn the transistor on or off.

12. The device as in claim 11 wherein the series of transistors are turned on to switch the current path as desired.

13. The device as in claim 11 wherein a control signal to turn the series of transistors on originates at a control circuit.

14. The device as in claim 13 wherein the control circuit is located in the decoder.

15. The device as in claim 7 wherein the first and second series of switch circuits are located beneath the cross-point array.

16. A method of selecting a memory cell in a cross-point array having a plurality of conductive lines, the array having switch circuits located along two adjacent conductive lines resulting in segments of the two adjacent conductive lines, the method comprising:

selecting a memory cell for writing, the memory cell coupled to one of the two adjacent conductive lines in an associated segment;

programming the switch circuits whereby the one of two adjacent conductive lines in the associated segment receives a programming current and a other of the two adjacent conductive lines in the associated segment receives no programming current; and programming the switch circuits whereby the two adjacent conductive lines in the other segments each receive a portion of the programming current.

17. The method of claim 16 wherein the switch circuits are switched by a series of control signals.

18. The method of claim 17 wherein the series of control signals originate at a control circuit.

19. The method of claim 16 wherein the portion of programming current is equal to about one-half of the programming current.

20. The method of claim 16 wherein the method further comprises providing programming current to a corresponding word line of the memory cell selected to allow data to be written to the selected memory cell.

* * * * *